United States Patent [19]
Klonis et al.

[11] Patent Number: 6,028,351
[45] Date of Patent: Feb. 22, 2000

[54] GASKET SEALED INTEGRATED CIRCUIT PACKAGE

[75] Inventors: Homer B. Klonis, Dallas; Robert G. McKenna, Houston; Don Hyde, Plano; Larry A. Harmon, Dallas, all of Tex.

[73] Assignee: Texas Instruments Incorporated, Dallas, Tex.

[21] Appl. No.: 08/941,870

[22] Filed: Sep. 30, 1997

[51] Int. Cl.⁷ .............................. H01L 23/02; H01L 23/12
[52] U.S. Cl. ..................... 257/680; 257/680; 257/688; 257/689; 257/701; 257/678; 257/703; 257/726; 257/727
[58] Field of Search ..................... 257/432, 434, 257/680, 701, 703, 704, 678, 727, 726, 731, 688, 732, 689; 438/106, 117, 121, 125

[56] References Cited

U.S. PATENT DOCUMENTS

| 3,622,419 | 11/1971 | London et al. | 156/242 |
|---|---|---|---|
| 3,831,131 | 8/1974 | Woodcock et al. | 339/95 |
| 5,099,392 | 3/1992 | Miller et al. | 361/400 |
| 5,293,511 | 3/1994 | Poradosih et al. | 257/434 |
| 5,426,505 | 6/1995 | Miller et al. | 333/247 |
| 5,770,816 | 6/1998 | Mcnulty et al. | 257/704 |
| 5,936,758 | 8/1999 | Fisher et al. | 359/224 |

*Primary Examiner*—Olik Chaudhuri
*Assistant Examiner*—Alonzo Chambliss
*Attorney, Agent, or Firm*—Charles A. Brill; Frederick J. Telecky, Jr.; Richard L. Donaldson

[57] ABSTRACT

A gasket sealed integrated circuit package (10) including a top member (12) clamped to a bottom member (18) with a gasket seal ring (26) sealed therebetween. Seal ring (26) encompasses an active portion (30) of an integrated circuit (22) to seal an active portion (30) from the ambient without inducing warp or stress on the circuit (30). The package further includes a glass lid (16) clamped within the package. The integrated circuit (22) preferably comprises a micromechanical device (30) formed on a ceramic substrate (24), such as a DMD type spatial light modulator, but can comprise of other devices as well. The package can be easily disassembled to change out the glass lid (16) or integrated circuit substrate (24) and allows sealing of the substrate (24) without subjecting the integrated circuit die (30) to elevated temperatures. The present invention is especially suited for elongated integrated circuits (30).

16 Claims, 2 Drawing Sheets

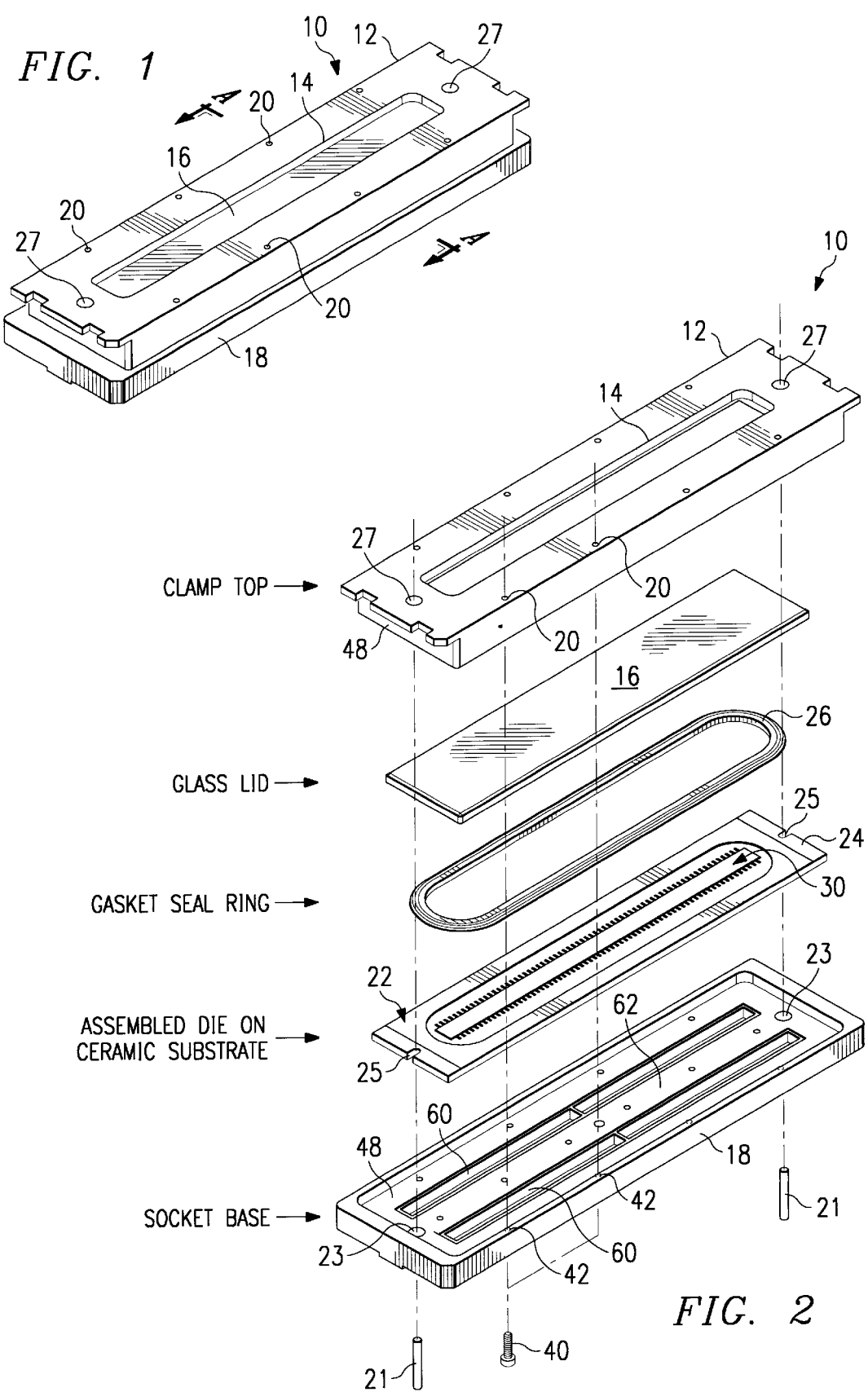

GASKET SEALED INTEGRATED CIRCUIT PACKAGE

FIELD OF THE INVENTION

The present invention is generally related to integrated circuit devices, and more particularly to the packaging of integrated circuit devices including micromechanical devices that need to be kept flat to avoid inducing warp or stress on the integrated circuit device.

BACKGROUND OF THE INVENTION

Spatial Light Modulators (SLMs) are widely used in the industry for video monitors, graphic displays, projectors, and hard copy printers. Spatial light modulators typically modulate incident light to form a light image. This light image is directed to a screen in the case of a projector, video monitor or display, or is ultimately focused on a light sensitive material, such as a photoreceptor drum, in the case of a xerographic printer.

A recent innovation of Texas Instruments Incorporated of Dallas, Tex. is the digital micromirror device (DMD). The DMD is a spatial light modulator suitable for use in displays, projectors and hard copy printers. The DMD is a micromechanical monolithic single-chip integrated circuit, comprised of a high density area array of 16 micron square deflectable micromirrors on 17 micron centers. These mirrors are fabricated over address circuitry including an array of memory cells and address electrodes, these memory cells being controlled by a row address circuit and loaded/unloaded by column pixel data shift registers. Each mirror forms one pixel of the DMD array, and is bistable through electrostatic attraction forces, that is to say, stable in one of two deflected positions. A source of light is directed upon the mirror array, and is reflected in one of two directions by each mirror. In one stable "on" mirror position, incident light is reflected by the mirror to a collector lens and focused on the display screen, or directed to the photoreceptor drum, and comprises one pixel. In the other "off" mirror position, light directed on the mirror is deflected to a light absorber. Each mirror of the array is individually controlled to either direct incident light into the collector lens, or, to the light absorber. The collector lens may be used in combination with a light prism to ultimately focus and magnify the light image from the pixel mirrors when projected onto a display screen to produce a viewable image. If each pixel mirror of the DMD array is in the "on" position, the light image will be a bright array of pixels.

For a more detailed discussion of the DMD device, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention, and the teachings of each are incorporated herein by reference. Gray scale of the pixels forming the image is achieved by pulse width modulation techniques of the mirrors, such as that described in U.S. Pat. No. 5,278,652, entitled "DMD Architecture and Timing for Use in a Pulse-Width Modulated Display System", assigned to the same assignee of the present invention, and the teachings of each are incorporated herein by reference.

The DMD device utilized in printing systems is an exceptionally elongated array of micromirrors, typically having a length in excess of 5 inches. Maintaining the optic's ability to focus on the full length of the DMD chip without compromise requires that the DMD integrated circuit be kept flat to within 1–3 mils. Therefore, the packaging can not induce warp or stress on the DMD device, i.e. package lid needs to be sealed to the package base without inducing warp or stress on the device. It is also critical that the package be sealed to prevent permeation of the ambient into the package, such as moisture and other impurities which can degrade or inhibit the operation of the tiny micromirrors and cause stiction, i.e. the mirrors sticking on the landing electrodes.

The DMD is a special micromechanical device requiring unique packaging elements, such as an optic window, in the lid. The package is difficult to assemble using more conventional IC packaging techniques. For instance, thermally cured adhesives induce warp in the device due to thermal mismatch of the package parts. Hermetic, seam welded packages are extremely difficult to fabricate due to the extensive length of the device and can also induce warp.

It is desired to provide a package that is suitable for encasing integrated circuits that need to be maintained flat, especially elongated devices such as the micromechanical DMD devices used in digital printing systems. The package should also be easy to disassemble to allow changing of the glass or the DMD device in the package. The package should maintain flatness of the integrated circuit device housed therewithin, and keep moisture out of the package to avoid degradation of the integrated circuit operation. In addition, the package should allow sealing of the package without subjecting the integrated circuit to elevated temperatures, to avoid damage to the micromechanical device.

SUMMARY OF THE INVENTION

The present invention achieves technical advantages as a packaged integrated circuit device including a resilient gasket ring disposed around the integrated circuit device and clamped between the package members. That is, the seal ring is secured between the top and bottom of package members, this seal ring preferably comprising a low permeable elastomer such as butyl rubber.

The present invention is an integrated circuit device comprising a bottom package member with an integrated circuit disposed thereon. A resilient member is positioned about the integrated circuit, and a top package member is disposed over and secured to the bottom package member to sealingly engage the resilient member. The resilient member preferably includes a reinforcing member secured thereto which defines a profile of the resilient member. The reinforcing member has a thickness being less than the resilient member thickness to allow the top and bottom package members to engage the resilient member and create a seal. The top and bottom package members are clamped to one another using fasteners. The top member includes a transparent member secured against the resilient member and preferably comprises glass.

In the preferred embodiment of the present invention, the top package member has a downwardly extending side wall encompassing the transparent member, the resilient member, and the integrated circuit (IC) mounting substrate to provide alignment during assembly. This side wall has several pairs of openings extending vertically therethrough. The fasteners extend through the bottom package member and are secured within these top package member openings to clamp the members together. The top package member has an aperture defined therethrough adjacent the transparent member. The integrated circuit is visible through the aperture such that the DMD integrated circuit modulates incident light. The top package member and the bottom package member preferably comprise of metal. The resilient member is sealed between a perimeter of the IC mounting substrate and the glass lid, whereby the resilient member preferably comprises a low permeable elastomeric material, such as butyl rubber.

The packaged device according to the present invention can be easily disassembled to change out the glass, or the DMD integrated circuit device. The unique clamping design of the present invention maintains flatness of the integrated circuit device to avoid warping or stress of the device. The elastomeric seal ring keeps moisture out of the package to avoid impurities from damaging the operation of the DMD device. The microsized mirrors of the device are sensitive to impurities. The device also allows sealing of the device without subjecting the integrated circuit to elevated temperatures, which is critical when processing a DMD device.

BRIEF DESCRIPTION OF THE DRAWINGS

FIG. 1 is a perspective view of an integrated circuit package according to the preferred embodiment of the present invention including a seal ring clamped between the top and bottom members;

FIG. 2 is an exploded view of the package shown in FIG. 1 illustrating the main components of the device, including a top and bottom package member, an optical glass lid, a gasket seal ring, and an elongated integrated circuit mounting substrate on which is mounted an IC die such as a DMD micromechanical device;

DETAILED DESCRIPTION OF THE PREFERRED EMBODIMENT

Figure 3:
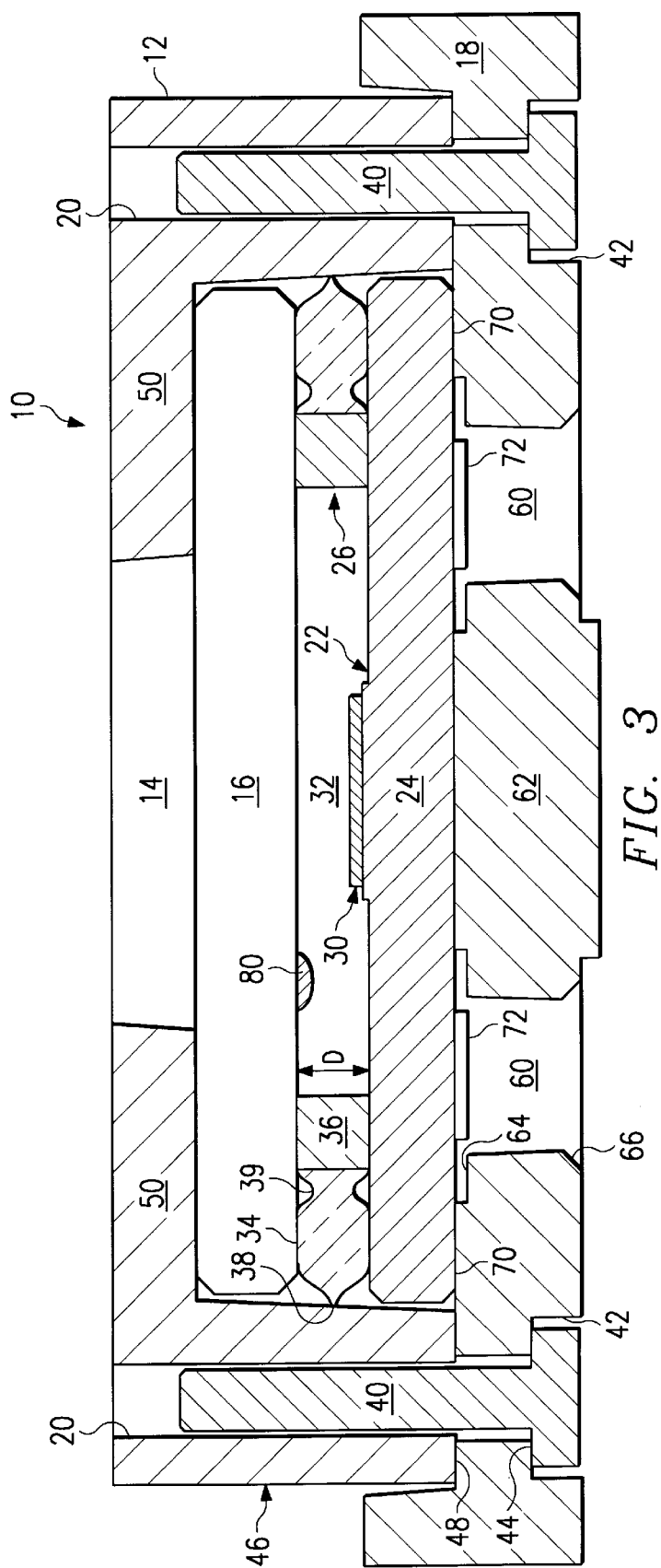
FIG. 3 is a sectional view taken along line A—A in FIG. 1, illustrating the assembled package whereby the elastomeric seal ring is sealed about the integrated circuit and between the top member glass window and the perimeter of the integrated circuit mounting substrate.

While the present invention will be described with reference to the preferred embodiment including an elongated micromechanical device, such as a DMD type spatial light modulator, it is to be understood that the present invention is well suited for packaging many types of devices that are sensitive to warping, stress or temperature such as integrated circuits, sensors and the like.

Referring now to FIG. 1, there is shown generally at 10 a perspective view of a packaged device according to the preferred embodiment of the present invention. Device 10 is seen to include an elongated top package member 12 having an elongated aperture 14 defined therethrough. A glass window 16 comprises a portion of top member 12 and is positioned across and below aperture 14. Package 10 is also seen to include a bottom or base package member 18. Several fasteners (FIG. 2) extend from and through the bottom member 18 and into threaded openings 20, each opening 20 being provided in top member 12 in alignment with openings in bottom member 18. These fasteners secure and clamp the top member 12 to the bottom member 18 as will be described shortly in reference to FIG. 3.

Referring now to FIG. 2, there is shown an exploded perspective view of the package 10 shown in FIG. 1. Illustrated in this Figure is the opposing top member 12 and bottom member 18, the glass lid 16, as well as an integrated circuit generally shown at 22 positioned within the package. A pair of alignment pins 21 are received through respective openings 23 extending through bottom member 18, peripheral notches 25 of the integrated circuit 22, and openings 27 extending through top member 12. Pins 21 provide alignment of integrated circuit 22 within the package, especially under aperture 14. Integrated circuit 22 has a ceramic substrate 24 on which is positioned an elongated die 30 comprising a DMD device.

Also illustrated is an elongated gasket seal ring 26 which encompasses the die 30 forming the active portion of the integrated circuit 22. When assembled, seal ring 26 is compressed and "sandwiched" between the glass lid 16 and the ceramic substrate 24, as shown in FIG. 3. The seal ring 26 is curved in a semicircle shape at each end to achieve uniform compression along the curved portion of the ring. The perimeter design has been engineered so that the rounded ends prevent application of uneven forces at the ends of the clamps. If the design were "squared off" it would take twice the force per linear inch to compress the gasket the same amount as the linear portion. The width of the gasket has been selected so the clamping force is directly over the bottom member 18 at 70. The clamping force is not over the gaps 60 in the lower member, thereby avoiding applying load to the ceramic package 24 which would cause bending and possible fracture of the ceramic substrate 24.

Turning now to FIG. 3, there is shown a cross section of package 10 taken along line A—A in FIG. 1. FIG. 3 illustrates the assembled package 10 whereby the resilient seal ring 26 creates a seal about the active die 30 of integrated circuit substrate 24 to seal the chamber 32 from the ambient. As shown, seal ring 26 has an outer "arrow shaped" flanged portion 34 comprised of an elastomeric material, such as butyl rubber. Measurements of moisture inside the cavity 32 have been made, whereby the die 30 responds accurately to the partial pressure of water in the atmosphere. Starting with a dry condition in cavity 32, the increase in the partial pressure of water was monitored with time over a several month period. The rate of change of the partial pressure was measured as $3 \times 10^{-13}$ grams/sec-torr. With a prescribed amount of a getter 80 inside the package, the cavity will maintain a partial pressure of water less than 1 torr for a period of five years. Butyl rubber was selected as the elastomer because of its known low permeability of water.

Seal ring 26 also has a rigid frame portion 36 preferably comprised of metal. The rigid portion 36 establishes and maintains the profile of the elastomeric gasket seal ring 26. The elastomeric material 34 is secured to frame 36 during the vulcanization of the rubber. The vertical height or thickness of the resilient portion 34 is thicker than the rigid frame portion 36, allowing the glass window 16 and the ceramic substrate 24 supporting die 30 to engage the resilient portion 36 and create a seal. The thickness of the rigid portion 36 is slightly less than the spacing "D" defined between the glass window 16 and the ceramic substrate 24 on which is mounted integrated circuit 30 when lid 12 is secured to base 18.

Figure 5:
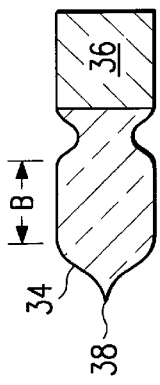
FIG. 5 is a cross section of the compressed seal ring.
Figure 4:
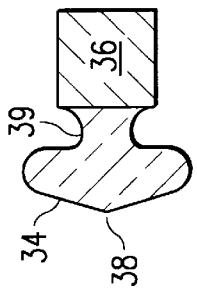
FIG. 4 is a cross section of the uncompressed seal ring.

The distal tip 38 of the resilient portion 34 is tapered outwardly away from the rigid portion 36 such that the resilient portion uniformly compresses and extend outwardly from the rigid portion 36 when compressed, creating an effective seal from the ambient. Referring to FIG. 4 and FIG. 5, the shape of the elastomeric seal 34 and the seal composition has been engineered to (1) provide the maximum resistance to gas permeation and (2) to achieve uniform compression around the entire seal. The "arrowhead" cross section shape of the uncompressed seal, as shown in FIG. 4, allows uniform compression from the tip 38 to the base, as shown in FIG. 5. The wide section, thru A, compresses into gaps 39 defined next to the metal retainer 36, as shown in FIG. 5. This provides a wider seal (distance B) and also prevents the elastomer from "flowing" over the metal retainer 36, which it would otherwise have a tendency to do if the width "A" was maintained constant all the way to the metal retainer.

Referring back to FIG. 3, several fasteners 40 extend upwardly, one through each respective opening 42 provided in pairs and defined through the perimeter of bottom member 18, as shown. Each opening 42 has a flanged portion defining a shoulder 44 which is engaged by the head of fastener 40. The top member 12, as previously discussed, has a pair of threaded openings 20 which receive the threaded portion of fasteners 40. The fasteners 40 clamp a flanged portion 46 of the top member 12 against the bottom member 18 at a shoulder 48 defined about the perimeter of the bottom member 18. The bottom surface of the flanged portion 46 interfaces and engages with the shoulder 48 of bottom member 18, causing the resilient seal ring to be compressed between glass lid 16 and integrated circuit substrate 24, while the substrate remains flat. As shown, top member 12 has an inwardly extending flange 50 which defines aperture 14, but which also engages, secures and clamps the glass window 16 to compress the glass window 16 against the seal ring 26. This flange 50 in combination with the flanged portion 46 secures the glass window 16 to seal ring 26, and seals the integrated circuit 30 therewithin.

Still referring to FIG. 3, the bottom member 18 is seen to have four elongated openings 60. Openings 60 extend adjacent and each side of an elongated portion 62 supporting the active die 30 of integrated circuit substrate 24. These elongated openings 60, as also shown in FIG. 2, receive respective elastomeric contact strips (not shown) which provide electrical contact between contact pad 72 of the integrated substrate 24 and contact pads on a printed wiring board (not shown) to which package 10 is mounted.

In the preferred embodiment, the fasteners 40 are torqued to about 3 in-lb. The top member 12 and the bottom member 18 are both preferably comprised of a composite aluminum-:silicon carbide metal to achieve a thermal match, but may also comprise of aluminum material. As mentioned earlier, the resilient portion 34 of gasket seal ring 26 preferably comprises of butyl rubber, but also can comprise of other elastomeric materials such as viton or fluorosilicones. Elastomeric materials are preferred because they have good sealing properties.

The material for clamping members 12 and 18 is composed of a composite of silicon carbide and aluminum. This composite was chosen for its high stiffness (XX MPa) so that it would hold the packaging system together under the clamping loads without bending. It also was selected because its coefficient of thermal expansion closely matches those of the glass lid 16 and ceramic base 24. This means that changes in temperature will not cause fracture or bending of the components, because all components will expand or contract at the same rate. Finally, the composite was selected because of its high thermal conductivity, meaning that heat will be quickly dissipated from the system.

A getter material 80 is placed inside package cavity 32 to absorb any water that permeates through the seal into the cavity. This material is described in copending provisional patent application Ser. No. 60/015,185 entitled "Micromechanical Device Including Time-Release Passivant", the teachings of which are incorporated herein by reference. Openings 60, as shown in FIG. 3, are wider at the top to define shoulder 64 and has a level 66 at the bottom. The wider opening defined by shoulder 64 provides electrical isolation between the contact pads 72 on bottom of 24 and the elastomeric connector (not shown) which contacts the signal pads.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. An integrated circuit package, comprising:
   a bottom package member;
   an integrated circuit disposed on said bottom package member;
   a resilient member disposed about said integrated circuit;
   said resilient member includes a reinforcing member secured thereto and defining a profile of the resilient member; and
   a top package member disposed over and secured to said bottom package member, said top package member sealingly engaging said resilient member.

2. The device as specified in claim 1 wherein said reinforcing member has a thickness being less than the thickness of said resilient member.

3. The device as specified in claim 1 wherein said bottom package member is clamped to said top package member.

4. The device as specified in claim 1 wherein said top package member further comprises a transparent member secured against said resilient member.

5. The device as specified in claim 1 wherein said transparent member comprises glass.

6. The device as specified in claim 5 wherein said top package member has a downwardly extending sidewall encompassing said transparent member and said resilient member.

7. The device as specified in claim 6 wherein said sidewall has several openings extending vertically therethrough.

8. The device as specified in claim 7 wherein said device has several fasteners extending through said bottom package member and secured into said top package member openings to clamp said bottom package member to top package member.

9. The device as specified in claim 4 wherein said top package member has an aperture defined therein adjacent said transparent member.

10. The device as specified in claim 4 wherein said top package member and said bottom package member comprise of a metal matrix composite.

11. The device as specified in claim 1 wherein said integrated circuit comprises a die mounted on a ceramic substrate.

12. The device as specified in claim 1 wherein said integrated circuit comprises a micromechanical device.

13. The device as specified in claim 1 wherein said resilient member is sealed against a perimeter of said integrated circuit.

14. The device as specified in claim 1 wherein said resilient member comprises an elastomeric material.

15. The device as specified in claim 1 including alignment means for aligning said integrated circuit within said device.

16. The device as specified in claim 1 wherein said alignment means comprises a pin extending through a reference notch defined in said integrated circuit and into either of said top package member or said bottom package member.

* * * * *

UNITED STATES PATENT AND TRADEMARK OFFICE
CERTIFICATE OF CORRECTION

PATENT NO.        : 6,028,351                                       Page 1 of 1
APPLICATION NO.   : 08/941870
DATED             : February 22, 2000
INVENTOR(S)       : Homer B. Klonis et al.

It is certified that error appears in the above-identified patent and that said Letters Patent is hereby corrected as shown below:

Title Page, insert Item [60] under Related U.S. Application Data

--Provisional Application No. 60/028,039  Oct. 9, 1996.--

Signed and Sealed this

Twenty-fifth Day of September, 2007

JON W. DUDAS
*Director of the United States Patent and Trademark Office*